United States Patent  
Lee

(10) Patent No.: US 6,998,200 B2
(45) Date of Patent: Feb. 14, 2006

(54) REFLECTION PHOTOMASKS WITH A CAPPING LAYER AND METHODS FOR MANUFACTURING THE SAME

(75) Inventor: Byoung-taek Lee, Seoul (KR)

(73) Assignee: Samsung Electronics Co., Ltd., (KR)

( * ) Notice: Subject to any disclaimer, the term of this patent is extended or adjusted under 35 U.S.C. 154(b) by 260 days.

(21) Appl. No.: 10/404,398

(22) Filed: Apr. 1, 2003

(65) Prior Publication Data

US 2003/0198874 A1  Oct. 23, 2003

(30) Foreign Application Priority Data

Apr. 18, 2002  (KR) .................... 10-2002-0021311

(51) Int. Cl.
*G01F 9/00*  (2006.01)

(52) U.S. Cl. ......................................................... 430/5
(58) Field of Classification Search .................. 430/5; 359/360, 361; 378/35

See application file for complete search history.

(56) References Cited

U.S. PATENT DOCUMENTS

| 5,928,817 A | 7/1999 | Yan et al. ................... 430/5 |
| 5,958,629 A | 9/1999 | Yan et al. ................... 430/5 |
| 6,013,399 A * | 1/2000 | Nguyen ....................... 430/5 |
| 6,756,163 B2 * | 6/2004 | Yan .............................. 430/5 |

FOREIGN PATENT DOCUMENTS

JP    2002-122981    4/2002

OTHER PUBLICATIONS

Notice to Submit Response; Korean Application No. 10-2002-0021311 (from Korean Patent Office) w/English Translation; Feb. 17, 2004.

Hoshino et al., *Process Scheme for Removing Buffer Layer on Multilayer of EUVL Mask.* In Photomask and Next-Generation Lithography Mask Technology VII. Hiroaki Morimoto, Editor, Proceedings of SPIE; vol. 4066 (2000).

Mangat et al., *EUV Mask Fabrication with Cr Absorber*, Proceedings of SPIE; vol. 3997; Emerging Lithographic Technologies, IV, ed. E. Dobisz (Mar. 2000).

* cited by examiner

Primary Examiner—S. Rosasco
(74) Attorney, Agent, or Firm—Myers Bigel Sibley & Sajovec

(57) ABSTRACT

A reflection photomask includes a reflection layer on a substrate, an absorber pattern on the reflection layer, and a capping layer on the reflection layer. The capping layer may be selected to decrease a reflectivity of the reflection photomask by less than about 20% of the reflectivity of the reflection layer.

42 Claims, 6 Drawing Sheets

US 6,998,200 B2

REFLECTION PHOTOMASKS WITH A CAPPING LAYER AND METHODS FOR MANUFACTURING THE SAME

RELATED APPLICATION

This application claims priority from Korean Patent Application No. 2002-0021311, filed Apr. 18, 2002, the disclosure of which is hereby incorporated herein by reference in its entirety as if set forth fully herein.

FIELD OF THE INVENTION

The present invention relates to semiconductor manufacturing processes, and more particularly, to reflection photomasks that may be used with extreme ultra violet EUV radiation and processes for manufacturing the same.

BACKGROUND OF THE INVENTION

High resolution exposure devices may be used in the manufacture of highly integrated semiconductor devices. Some high resolution exposure devices use a deep-ultraviolet (DUV) light source of 248 nm wavelength to expose a 250 nm pattern. Some other exposure devices use a DUV light source of 193 nm wavelength to expose a 100 to 130 nm pattern. Recent advances in exposure devices have enabled the use of an extreme ultraviolet (EUV) source, a so-called soft X-ray radiation source, to obtain an exposure pattern with a size that is less than 100 nm, and which may be capable of obtaining pattern sizes from 5 to 70 nm.

Exposure devices that use EUV differ from those that use DUV because, for example, most materials have high light absorption in EUV regions, leading to the use of a reflection photomask instead of a transmission photomask. An EUV photomask may include an absorber pattern that is formed on a reflector (mirror). The absorber pattern is highly absorptive to EUV radiation, and the reflector has a high reflectivity to EUV radiation.

FIG. 1 is a cross-sectional view of a conventional reflection photomask 100. A multi-layered reflection layer 20 is formed on a substrate 10 of silicon or glass. A soft X-ray absorber pattern 30 made of tantalum nitride TaN and having a predetermined pattern is formed on the reflection layer 20.

When the absorber pattern 30 is patterned, the reflection layer 20 may become damaged and its reflectivity may be decreased. The reflection layer 20 may become polluted, or contaminated, when the reflection photomask 100 is used during an EUV exposure process. Pollution of the reflection layer 20 may include oxidation from the decomposition of $H_2O$ and/or hydrocarbon in the presence of high EUV light and/or by the deposition of carbon on the reflection layer 20. Pollution of the reflection layer 20 may decrease the reflectivity of the reflection layer 20.

SUMMARY OF THE INVENTION

Embodiments of the present invention provide a reflection photomask that has an associated reflectivity to extreme ultra violet (EUV) radiation. The reflection photomask includes a reflection layer on a substrate, an absorber pattern on the reflection layer, and a capping layer on the reflection layer. The reflection layer is a material that is reflective to EUV radiation. The absorber pattern is a material that absorbs EUV radiation. The capping layer is selected to change the reflectivity of the reflection photomask by less than about 20% of the reflectivity of the reflection layer.

In further embodiments of the present invention, the capping layer may be selected to increase the reflectivity of the reflection photomask over that of the reflection layer. The capping layer may be ruthenium, a group VII metal, and/or may have a thickness of less than about 3 nm. The capping layer may be selected to decrease the reflectivity of the reflection photomask by less than about 20% of the reflectivity of the reflection layer, and may have a thickness less than about 6 nm.

According to other embodiments of the present invention, a reflection photomask includes a reflection layer on a substrate, an absorber pattern on the reflection layer, and a capping layer on the reflection layer.

The reflection photomask may include a buffer layer of ruthenium, or a group VIII metal, interposed between the reflection layer and the absorber pattern. The reflection photomask may include a buffer layer interposed between the reflection layer and the absorber pattern, and an etch stopper interposed between the buffer layer and the reflection layer. The reflection photomask may include a first buffer layer between the reflection layer and the absorber pattern, and which may be in a reflection region between the absorber pattern. The first buffer layer in the reflection region may be thinner than the first buffer layer between the reflection layer and the absorber pattern.

The reflection photomask may further include a second buffer layer between the first buffer layer and the absorber pattern, and the capping layer may be directly on the first buffer layer in the reflection region. The reflection photomask may include a stress relaxation layer interposed between the substrate and the reflection layer.

DETAILED DESCRIPTION OF THE INVENTION

Figure 1:
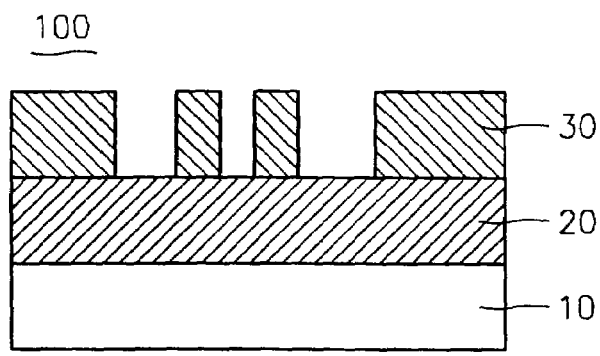
FIG. 1 is a cross-sectional view of a conventional reflection photomask.

The present invention will now be described more fully with reference to the accompanying drawings in which preferred embodiments of the invention are shown. This invention may, however, be embodied in many different forms and should not be construed as being limited to the embodiments set forth herein; rather, these embodiments are provided so that this disclosure will be thorough and complete and, will fully convey the concept of the present invention to those skilled in the art. In the drawings, the thickness of layers and regions are exaggerated for clarity. It will also be understood that when an element, such as a layer, a substrate, or the like, is referred to as being "on" another element, it can be directly on the other element, or intervening elements may also be present. Like numbers refer to like elements throughout.

Figure 2:
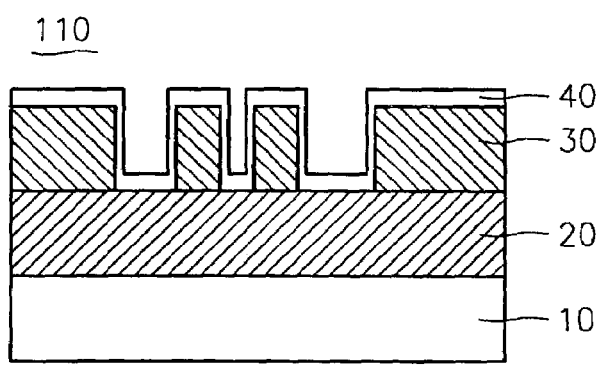
FIGS. 2–11 are cross-sectional views of reflection photomasks according to embodiments of the present invention.

FIG. 2 is a cross-sectional view of a reflection photomask 110 having an associated reflectivity to extreme ultra violet (EUV) radiation according to embodiments of the present invention. The reflection photomask 110 includes a reflection layer 20 on a substrate 10, an absorber pattern 30 on the reflection layer 20, and a capping layer 40 on the reflection layer 20 and the absorber pattern 30. The reflection layer 20 comprises a material that is reflective to EUV radiation. The absorber pattern 30 comprises a material that absorbs EUV radiation.

The substrate 10 may include silicon and/or glass. The capping layer 40 may cover both the absorber pattern 30 and the reflection layer 20. The reflection layer 20 may include two or more material layers that are stacked on one another. For example, the reflection layer 20 may include stacked layers of molybdenum Mo and silicon Si. The uppermost layer of the reflection layer 20 may be molybdenum or silicon, however, in certain embodiments the uppermost layer is silicon because a highly stable native oxide layer may be formed on the silicon surface. The thickness of the individual silicon and/or molybdenum layers can be several nanometers (nm) each, and the number of layers can include, for example, several tens of layers.

The reflection layer 20 may include molybdenum Mo, scandium Sc, titanium Ti, vanadium V, chromium Cr, ferrum Fe, nickel Ni, cobalt Co, zirconium Zr, niobium Nb, technetium Tc, ruthenium Ru, rhodium Rh, hafnium Hf, tantalum Ta, tungsten W, rhenium Re, osmium Os, iridium Ir, platinum Pt, copper Cu, palladium Pd, silver Ag, and/or gold Au or combinations thereof. The reflection layer 20 may also include silicon carbon, silicon nitride, oxysilicon, boron nitride, beryllium nitride, aluminum nitride, and/or oxy aluminum in place of silicon in a stacked layer structure.

The absorber pattern 30 may include tantalum nitride TaN, tantalum Ta, chromium Cr, titanium nitride TiN, titanium Ti, aluminum copper alloy Al—Cu, NiSi, TaSiN, TiSiN, and/or aluminum Al or combinations thereof. In certain embodiments, the absorber pattern 30 has a thickness of less than 200 nm.

The capping layer 40 may include a material with a higher oxidation resistance than silicon. In some embodiments of the present invention, the capping layer 40 includes ruthenium Ru, Pt, Ir, Pd, a group VIII metal, or combinations thereof.

Figure 12:
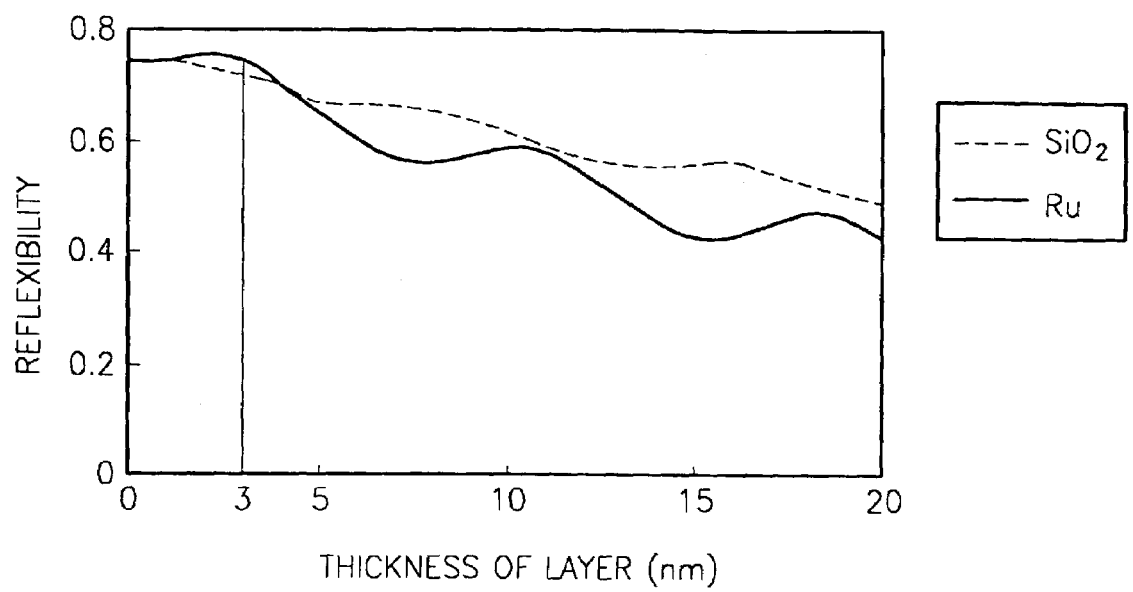
FIG. 12 is a graph showing simulation results for the reflectivity of two reflection photomasks, one having a $SiO_2$ capping layer and another having a Ru capping layer, versus the thickness thereof, according to embodiments of the present invention.

FIG. 12 is a graph showing simulation results of the reflectivity of two reflection photomasks, one having a capping layer of $SiO_2$ and another having a capping layer of ruthenium, versus the thickness of the capping layer. The horizontal axis denotes the thickness (nm) of the capping layer and the vertical axis denotes the reflectivity of the reflection photomask. For the simulation, the reflection layer included 40 stacked layers of Si (thickness of 4.14 nm) and Mo (thickness of 2.76 nm) pairs. The capping layer was on a $SiO_2$ layer (referred to as a native oxide layer formed on a Si layer and having a thickness of 2 nm), and which was on the uppermost layer of the 40 layer pairs of the reflection layer. The wavelength of the EUV radiation was 13.5 nm and the angle of the incident radiation was 0°.

As is also shown in FIG. 12, the thickness of the ruthenium capping layer may be selected to change the reflectivity of the reflection photomask relative to the reflectivity of the reflection layer. For the reflection photomask having a $SiO_2$ capping layer, the reflectivity of the reflection photomask decreases slowly from about 0.75 with increasing thickness of the capping layer. In contrast, for the reflection photomask having a ruthenium capping layer, the reflectivity of the reflection photomask increases as the thickness of the capping layer increases from about 0 to 3 nm. Consequently, the thickness of a ruthenium capping layer may be less than about 3 nm if a reflectivity of the reflection photomask is desired to be greater than that of the reflection photomask without the capping layer.

As is also shown, the thickness of the capping layer may be selected to decrease the reflectivity of the reflection photomask by less than about 20% of the reflectivity of the reflection layer (i.e., relative to the reflection photomask without a capping layer). For example, a ruthenium capping layer may be formed that has a thickness of less than about 6 nm, or a $SiO_2$ capping layer may be formed that has a thickness of less than about 11 nm. Consequently, it is possible to select a thickness and a material for the capping layer to provide a desired reflectivity for a reflection photomask.

Accordingly, a capping layer may be provided on a reflection photomask to reduce pollution on the surface of the reflection layer during an exposure process, and without decreasing the reflectivity of the reflection photomask, or with an acceptable decrease in the reflectivity.

Referring again to FIG. 2, and in light of the simulation results shown in FIG. 12, the capping layer 40 may have a thickness that decreases a reflectivity of the reflection photomask 120 by less than 20% of the reflectivity of the reflection layer 20 (i.e., compared with the reflectivity of a reflection photomask without a capping layer 40). The reflectivity of the reflection photomask 110 may be increased over that of the reflection layer 20 by using a ruthenium-capping layer 40 that has a thickness less than about 3 nm.

Figure 3:
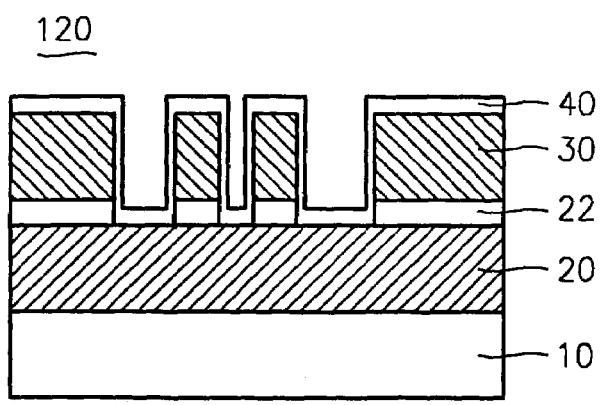

FIG. 3 is a cross-sectional view of a reflection photomask 120 according to other embodiments of the present invention. The reflection photomask 120 is similar to the reflection photomask 110 that is shown in FIG. 2, except that a buffer layer 22 is interposed between the reflection layer 20 and the absorber pattern 30. The buffer layer 22 may include silicon oxide SiOx, and may be patterned the same as the absorber pattern 30.

The reflection photomask 120 that is shown in FIG. 3 may be manufactured by forming the reflection layer 20, such as from stacked layers, on the substrate 10. The buffer layer 22 may be formed on the reflection layer 20. An absorber layer may be formed on the buffer layer 22 from a material that absorbs EUV radiation. The absorber layer may be patterned by photolithography to form the absorber pattern 30. A portion of the buffer layer 22 may be removed between the absorber pattern 30, such as by dry etching. The surface of the reflection layer 20 between the absorber pattern 30 may then be exposed by removing the remaining buffer layer 22, such as by wet etching. The capping layer 40 may be formed on the reflection layer 20, and may extend across the entire surface of the substrate 10 including the reflection layer 20 and the absorber pattern 30. The capping layer 40 may be formed by a sputtering process.

By wet etching the buffer layer 22 to expose the absorber pattern 30, damage to the upper surface of the reflection layer 20 may be reduced. The capping layer 40 may reduce pollution of the reflection layer 20, such as during an EUV radiation exposure process.

Figure 4:
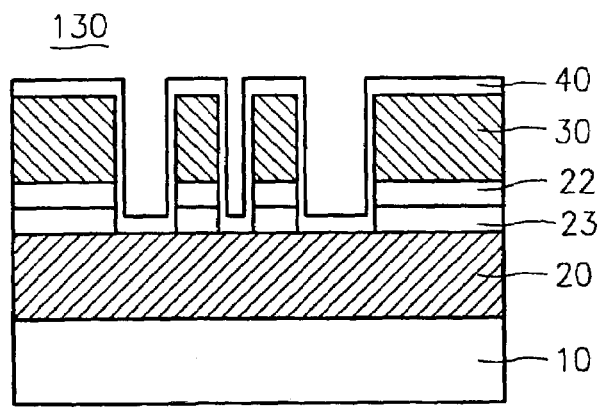

FIG. 4 is a cross-sectional view of a reflection photomask 130 according to further embodiments of the present invention. The reflection photomask 130 is similar to the reflection photomask 120 of FIG. 3, except that a buffer layer 22' and an etch stop layer 23 are interposed between the reflection layer 20 and the absorber pattern 30. The buffer layer 22' may include SiON, and the etch stop layer 23 may include Cr. The buffer layer 22' and the etch stop layer 23 may be patterned the same as the absorber pattern 30.

The embodiment of the reflection photomask 130 shown in FIG. 4 may be manufactured by forming a reflection layer 20, such as from stacked layers, on the substrate 10. The etch stop layer 23 may include chromium, and may be formed on the reflection layer 20. The buffer layer 22' may include silicon nitride oxide, and may be formed on the etch stopper layer 23. An absorber material layer may be formed on the buffer layer 22' and patterned to form the absorber layer pattern 30. The buffer layer 22' may be etched by photolithography after patterning the absorber material layer to form the absorber layer pattern 30. The etch selectivity of silicon nitride oxide to chromium is high, so that the etching of the buffer layer 22 may be stopped at the etch stopper layer 23. The surface of the reflection layer 20 may be exposed by removing the etch stopper layer 23. A capping layer 40 may be formed on the entire surface of the substrate 10 on which the absorber pattern 30 is formed.

The etch stopper layer 23 may reduce etching damage to the surface of the reflection layer 20. The capping layer 40 may also reduce pollution on the surface of the reflection layer 20, such as when performing an EUV radiation exposure process using the reflection photomask 130.

Figure 5:
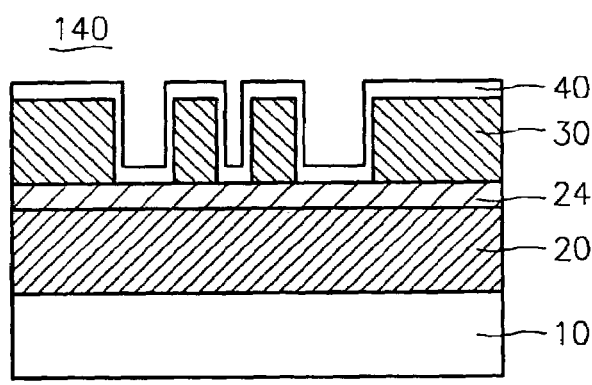
Figure 6:
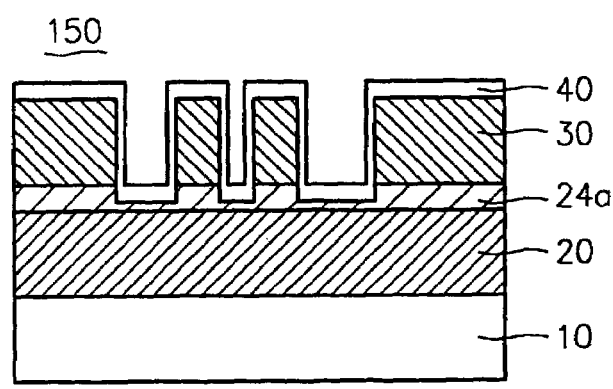
Figure 7:
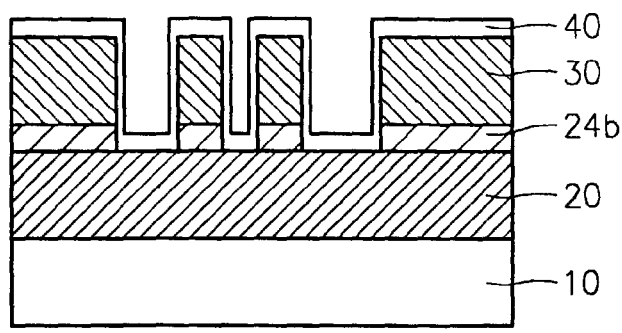

FIG. 5 is a cross-sectional view of a reflection photomask 140 according to embodiments of the present invention. FIGS. 6 and 7 are cross-sectional views showing reflection photomasks that are similar to the reflection photomask 140 of FIG. 5. The reflection photomasks shown in FIGS. 5–7 are similar to the reflection photomask 110 of FIG. 2, except that a buffer layer 24 is interposed between the reflection layer 20 and the absorber pattern 30.

Referring to FIG. 5, the buffer layer 24, which may include ruthenium, is interposed between the reflection layer 20 and the absorber pattern 30, and may further extend across the entire surface of the reflection layer 20. The absorber pattern 30 is formed on the reflection layer 20 and defines an absorber region, in which EUV light is absorbed, and defines a reflection region that is recessed between the absorber pattern and in which EUV light is reflected. In light of the simulation results that were discussed with regard to FIG. 12, the thickness of the ruthenium buffer layer 24 may be several nm to several tens of nm to provide at least a minimum desired reflectivity for the reflection photomask 110. The buffer layer 24 may include a material with higher oxidation resistance than silicon, and/or may include Ru, Pt, Ir, Pd, or a metal of group VIII.

The absorber pattern 30 may include tantalum nitride TaN, tantalum Ta, chromium Cr, titanium nitride TiN, titanium Ti, aluminum-copper alloy Al—Cu, NiSi, TaSiN, TiSiN, and/or Al. In certain embodiments, the absorber pattern 30 has a thickness that is less than 200 nm.

Figure 13A:
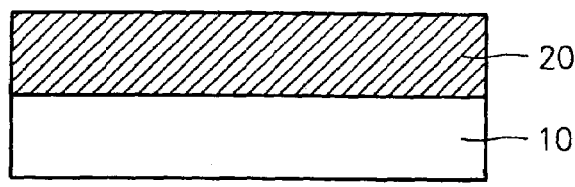
FIGS. 13a–e are cross-sectional views that illustrate a process for fabricating the reflection photomask of FIG. 5, according to embodiments of the present invention.

FIGS. 13*a–e* are cross-sectional views of steps for manufacturing the reflection photomask 140 of FIG. 5 according to embodiments of the present invention. Referring to FIG. 13*a*, a reflection layer 20, which may include stacked molybdenum and silicon layers, is formed on the surface of the substrate 10. A RF magnetron spuffering process or an ion beam sputtering process may be used to form the stacked layers. The particular sputtering process may depend upon the apparatus used in the fabrication process. The reflection layer 20 may be formed from stacked layers of Molybdenum and silicon, and each pair of stacked layers may have a thickness of 7 nm and may have a maximum reflectivity in the wavelength region of 13.4 nm.

Figure 13B:
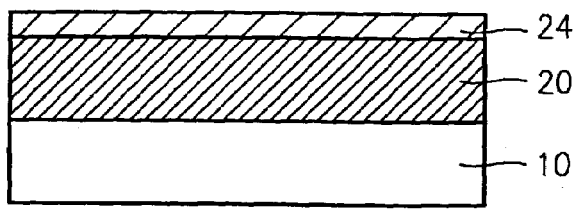

The ratio of molybdenum to silicon in one pair of layers may be 40%, the thickness of the molybdenum layers may be about 2.8 nm (e.g., 2.76 nm), and the thickness of the silicon layers may be about 4.2 nm (e.g., 4.14 nm). The reflection layer 20 may be formed from 40 stacked pairs of molybdenum and silicon layers, and a silicon layer may be formed on an uppermost layer so as to provide a total of 81 layers. Referring to FIG. 13*b*, the buffer layer 24, that may include ruthenium, any may be formed on the surface of the reflection layer 20. A DC sputtering method may be used with the following conditions: DC power=1 kW, pressure=0.3 Pa, and an argon gas atmosphere.

Figure 13C:
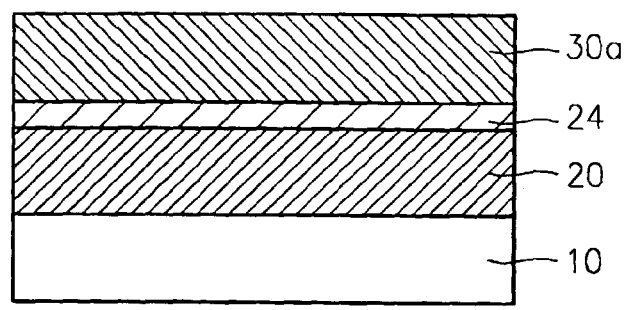

As shown in FIG. 13*c*, an absorber layer 30*a* may include nitride and/or tantalum, and may be formed on the surface of the buffer layer 24. A reaction sputtering process may be used, such as when the absorber 30*a* is formed from a nitride. A DC sputtering method may alternatively be used.

Figure 13D:
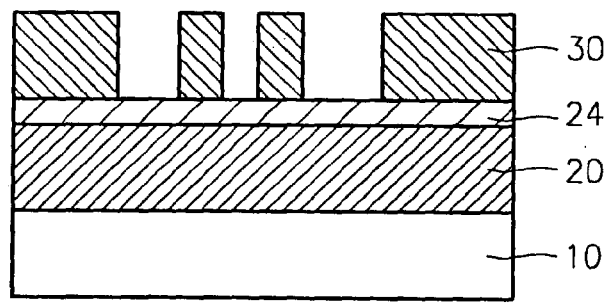

As shown in FIG. 13*d*, the absorber pattern 30 may be formed by patterning the absorber layer 30*a* by photolithography. A resist pattern (not shown) may be formed on the absorber layer 30*a*, and the absorber layer 30*a* may be etched using the resist pattern as a mask.

When the absorber layer 30*a* includes tantalum nitride, the absorber layer 30*a* may be etched under the following conditions: gas $Cl_2/Ar=80/40$ ml/min, ECR power=600 W, RF bias power=30 W, pressure=5 pa, and a substrate temperature=50° C. When etching of the absorber layer 30*a* is stopped prior to an over-etching into the buffer layer 24, the thickness of the buffer layer 24 in the reflection region may become the same as the thickness of the buffer layer 24 between the absorber pattern 30 and the reflection layer 20.

Figure 13E:
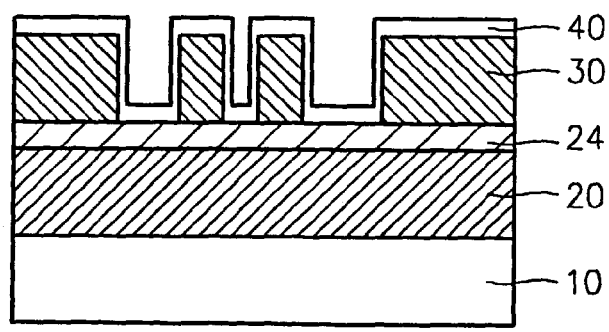

The mask may be repaired using a focus ion beam FIB, if necessary. A mask repair may also be done using gas-assisted etching GAE. In this case, $Br_2$ may be used as an etching gas, but the etching gas may differ according to the material used for the absorber layer 30 and the buffer layer 24. As shown in FIG. 13E, the capping layer 40 may be formed on the entire surface of the substrate 10 on which the absorber pattern 30 is formed.

The two step etching process may simplify the manufacturing process, relative to that for the reflection photomasks of FIGS. 2–3, and may prevent the surface of the reflection layer 20 from being damaged during the etching process, because the ruthenium buffer layer 24 remains on the reflection layer 20. The capping layer 40 on the surface of the reflection layer 20 may prevent pollution of the surface of the reflection layer 20, such as from subsequent EUV radiation exposure processes.

In the embodiments of FIGS. 5–6, and as discussed with reference to FIG. 12, the material and/or the thickness range of the buffer layer 24 and/or the capping layer 40 may be selected to provide a desired reflectivity of the reflection photomask.

The buffer layer 24 and the capping layer 40 may be formed from ruthenium, and the combined thickness of the buffer layer 24 and the capping layer 40 may be in the range of 0 to about 3 nm. The capping layer 40 may cause undesirable distortions on the front or side surfaces of the absorber pattern 30. However the thickness of the capping layer 40 that is formed on the sidewalls of the absorber pattern 30 may be reduced or minimized by forming the capping layer 40 with a sputtering method with poor step coverage.

FIG. 6 is a cross-sectional view of a reflection photomask 150 according to other embodiments of the present invention. The reflection photomask 150 is similar to that of FIG. 5, except that an over etching is performed on the buffer layer 24*a* to make the thickness of the ruthenium layer 24 in the reflection region, in the recessed portions between the absorber pattern 30, thinner than that between the absorber pattern 30 and the reflection layer 20. The reduced thickness of the buffer layer 24a in the reflection region may be advantageous in that it may allow a greater margin for the thickness of the capping layer 40, relative to the embodiment of the reflection photomask 140 of FIG. 5. Accordingly, a desired combined thickness of the buffer layer 24a and the capping layer 40 may be more easily obtained to provide a desired reflectivity for the reflection photomask 150.

FIG. 7 is a cross-sectional view of a reflection photomask 160 according to still other embodiments of the present invention. The reflection photomask 160 is similar to that of FIG. 5, except that the buffer layer 24b may be removed from the reflection region. The reflection photomask 160 may be manufactured as was described above with referenced to FIGS. 13a–e. The absorber layer 30 may be etched until the surface of the buffer layer 23b is exposed. The absorber layer 30 may be etched without etching the buffer layer 24b, or it may be over etched into the buffer layer 24b. The buffer layer 24b, which may include ruthenium, may be etched away after the absorber layer 30 has been etched. The buffer layer 24b may be etched using the absorber pattern 30 as a mask. The capping layer 40 may then be formed directly on the reflection layer 20.

Damage to the surface of the reflection layer 20 may be avoided when etching the buffer layer 24b by using a high etch selectivity. A etch selectivity of 19.3:1 may be provided with respect to non-crystalline silicon (the uppermost layer of the reflection layer) formed with a sputtering method. The buffer layer 24b of ruthenium is etched using with a dry etching process, such as a Electron Cycrotron Resonance type device, the conditions gas $Cl_2/O_2$, ($Cl_2$ contents: 30%), ECR power=300 W, RF bias power=30 W, and the temperature of the substrate=50° C. may be used.

It may be possible to control over etching of the surface of the reflection layer 20 by controlling the etching conditions to prevent the decrease of the reflectivity of the reflection photomask 160, even though the ruthenium buffer layer 24b in the reflection region is etched and removed. Like the reflection photomask 150 in FIG. 6, it may be advantageous to provide a larger margin for the thickness of the capping layer 40 in the reflection region, by removing the buffer layer 24b in the reflection region.

Figure 8:
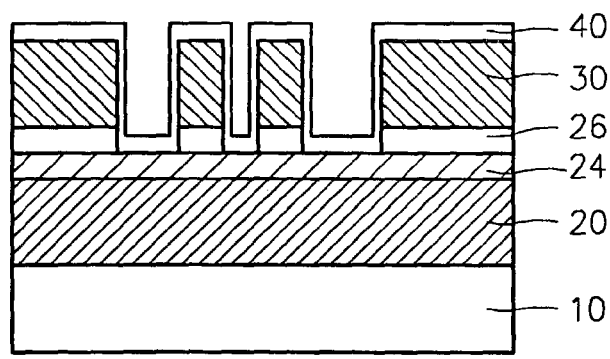

FIG. 8 is a cross-sectional view of a reflection photomask 170 according to still other embodiments of the present invention. The reflection photomask 170 is similar to the reflection photomask 160 of FIG. 7, except that it includes a second buffer layer 26, which may include a semiconductor material, interposed between the first buffer layer 24 and the absorber pattern 30. The first buffer layer 24 may be formed on the surface of the reflection layer 20, the second buffer layer 26 may be formed on the first buffer layer 24, and the absorber pattern 30 may be formed on the second buffer layer 26. The second buffer layer 26 may be patterned to remove the second buffer layer 26 in the reflection region between the absorber pattern 30.

The material and the thickness of the first buffer layer 24 may be the same as that described for the reflection photomask 140 of FIG. 5. The second buffer layer 26 may be a silicon oxide layer, silicon nitride layer, and/or silicon oxynitride layer. In certain embodiments of the present invention, the thickness of the second buffer layer 26 to range between several tens of nm and 100 nm.

The reflection photomask 170 may be manufactured by forming the first buffer layer 24 from ruthenium on the surface of the reflection layer 20, and forming the second buffer layer 26 from silicon oxide on the surface of the first buffer layer 24. A sputtering method or a plasma CVD method may be used, which may be helpful for low temperature deposition in order to avoid changes of the reflectivity of the reflection layer 20. In the case of depositing silicon oxides at a low temperature, the RF sputtering method may be used. In the case of depositing silicon oxynitride, the plasma CVD may be used.

The absorber pattern 30 is formed on the surface of the second buffer layer 26 as described above, and the second buffer layer 26 is etched using the absorber pattern 30 as a mask. If the second buffer layer 26 is made of silicon oxide, the etching may be performed by an ECR method. The second buffer layer 26 may be etched until the surface of at least the first buffer layer 24 is exposed, under the conditions: gas $Ar/C_4F_8/O_2$=200/10/20 ml/min, ECR power=600 W, RF bias power=15 W, and the temperature of a substrate=50° C. In addition, if the second buffer layer 26 is made of silicon oxynitride, the buffer layer 26 may be etched using a fluoride gas.

During etching, the first buffer layer 24 may be used as an etch stopper.

If $Ar/C_4F_8/O_2$ is used as an etch gas, the etch rate may become more than 70 nm/min with respect to the silicon oxide layer. It has been found that when the same etch gas for the silicon oxide layer is used for a ruthenium layer, the ruthenium layer is hardly etched, and may, therefore, serve as an etch stopper.

Figure 9:
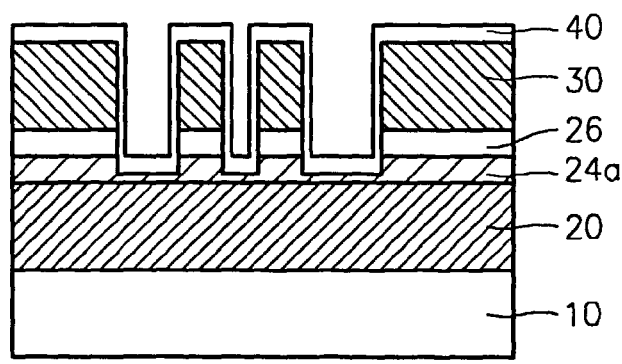

FIG. 9 is a cross-sectional view of a reflection photomask 180 that is similar to that of FIG. 8, except that the buffer layer 24a has been over etched to reduce the thickness of the ruthenium layer 24 so that it is thinner in the reflection region (recessed area between the absorber pattern 30) than between the absorber pattern 30 and the reflection layer 20. Because the thickness of the buffer layer 24a in the reflection region is reduced, it may 30 allow a greater margin in the selection of a thickness of the capping layer 40.

Figure 10:
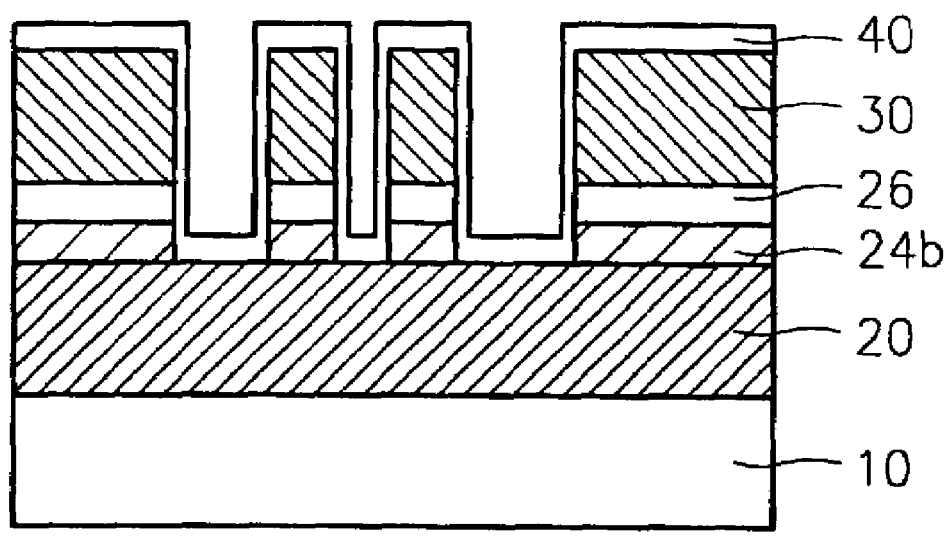

FIG. 10 is a cross-sectional view of a reflection photomask 190 that is similar to that of FIG. 8, except that the buffer layer 24b has been removed from the reflection region. The second buffer layer 26 may be etched until the surface of the first buffer layer 24b is exposed. The first buffer layer 24b may be etched, or over etched, because the buffer layer 24b, which may include ruthenium, may be etched away later.

Figure 11:
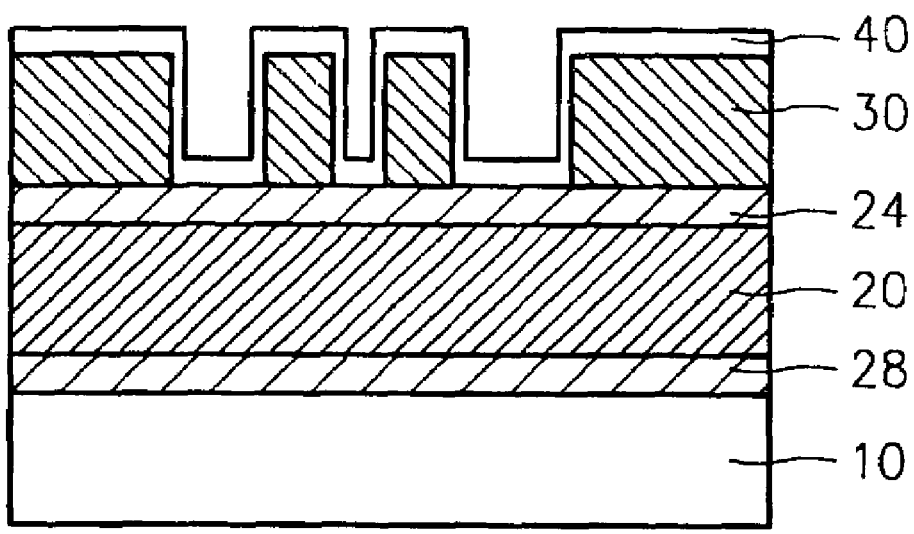

FIG. 11 is a cross-sectional view of a reflection photomask 200 that is similar to the photomasks discussed above, except that a stress relaxation layer 28 is interposed between the substrate 10 and the reflection layer 20. The stress relaxation layer 28 may be formed from ruthenium or molybdenum. Use of a stress relaxation layer between a substrate and a reflection layer may prevent the surface of the reflection layer from being damaged, such as becoming warped and losing reflectivity, and may further prevent the surface of the reflection layer from being polluted during the manufacturing process. More particularly, internal stress of the reflection layer 20, which may be caused by use of stacked multilayers, such as molybdenum Mo and silicon Si, may be in an opposing direction to internal stress of the stress relaxation layer 28, a single layer structure, so that the internal stress of the reflection layer 20 may be relieved.

While this invention has been particularly shown and described with reference to embodiments thereof, it will be understood by those skilled in the art that various changes in form and details may be made therein without departing from the spirit and scope of the invention as defined by the appended claims.

What is claimed is:

1. A reflection photomask having an associated reflectivity to extreme ultra violet (EUV) radiation, the reflection photomask comprising:
   a substrate;
   a reflection layer on the substrate, the reflection layer comprising a material that has an associated reflectivity to EUV radiation;
   an absorber pattern on the reflection layer, the absorber pattern comprising a material that absorbs EUV radiation; and
   a capping layer on the reflection layer, wherein the capping layer is selected to change the reflectivity of the reflection photomask by less than about 20% of the reflectivity of the reflection layer.

2. The reflection photomask of claim 1, wherein the capping layer is selected to increase the reflectivity of the reflection photomask over that of the reflection layer.

3. The reflection photomask of claim 2, wherein the capping layer comprises ruthenium.

4. The reflection photomask of claim 2, wherein the capping layer has a thickness less than about 3 nm.

5. The reflection photomask of claim 2, wherein the capping layer comprises a group VIII metal.

6. The reflection photomask of claim 2, wherein the capping layer comprises Pt, Ir, and/or Pd.

7. The reflection photomask of claim 1, wherein the capping layer is selected to decrease the reflectivity of the reflection photomask by less than about 20% of the reflectivity of the reflection layer.

8. The reflection photomask of claim 7, wherein the capping layer has a thickness less than about 6 nm.

9. The reflection photomask of claim 1, wherein the capping layer covers the reflection layer and the absorber pattern.

10. The reflection photomask of claim 1, wherein the capping layer comprises a material having a higher oxidation resistance than silicon.

11. The reflection photomask of claim 1, wherein the capping layer comprises ruthenium.

12. The reflection photomask of claim 1, wherein the capping layer comprises a group VIII metal.

13. The reflection photomask of claim 1, wherein the capping layer comprises Pt, Ir, and/or Pd.

14. The reflection photomask of claim 1, wherein the reflection layer comprises a plurality of first and second material layers that are alternatively stacked.

15. The reflection photomask of claim 14, wherein the first material layer is at least one of the group consisting of scandium Sc, titanium Ti, vanadium V, chromium Cr, ferrum Fe, nickel Ni, cobalt Co, zirconium Zr, niobium Nb, technetium Tc, ruthenium Ru, rhodium Rh, hafnium Hf, tantalum Ta, tungsten W, rhenium Re, osmium Os, iridium Ir, platinum Pt, copper Cu, palladium Pd, silver Ag, and gold Au, and the second material layer is at least one of the group consisting of silicon, silicon carbon, silicon nitride, oxysilicon, boron nitride, beryllium nitride, aluminum nitride, and oxy aluminum.

16. The reflection photomask of claim 1, further comprising a buffer layer of ruthenium interposed between the reflection layer and the absorber pattern.

17. The reflection photomask of claim 1, further comprising a buffer layer of a group VIII metal interposed between the reflection layer and the absorber pattern.

18. The reflection photomask of claim 1, further comprising:
   a buffer layer interposed between the reflection layer and the absorber pattern; and
   an etch stopper interposed between the buffer layer and the reflection layer.

19. The reflection photomask of claim 1, further comprising a first buffer layer interposed between the reflection layer and the absorber pattern, and wherein the first buffer layer is on the reflection layer in a reflection region between portions of the absorber pattern.

20. The reflection photomask of claim 19, wherein the first buffer layer in the reflection region is less thick than the first buffer layer between the reflection layer and the absorber pattern.

21. The reflection photomask of claim 19, further comprising a second buffer layer interposed between the first buffer layer and the absorber pattern, and wherein the capping layer is directly on the first buffer layer in the reflection region.

22. The reflection photomask of claim 1, further comprising a stress relaxation layer interposed between the substrate and the reflection layer.

23. The reflection photomask of claim 22, wherein the stress relaxation layer comprises ruthenium or molybdenum.

24. The reflection photomask of claim 1, further comprising a native oxide layer directly on the reflection layer.

25. A method for manufacturing a reflection photomask having an associated reflectivity to extreme ultra violet (EUV) radiation, the method comprising:
   forming a reflection layer on a substrate, the reflection layer comprising a material that has a reflectivity to EUV radiation;
   forming an absorber pattern on the reflection layer, the absorber pattern comprising a material that absorbs EUV radiation; and
   forming a capping layer on the reflection layer, wherein the capping layer is selected to change the reflectivity of the reflection photomask by less than about 20% of the reflectivity of the reflection layer.

26. The method of claim 25, further comprising selecting the capping layer to increase the reflectivity of the reflection photomask over that of the reflection layer.

27. The method of claim 26, wherein the capping layer comprises ruthenium.

28. The method of claim 26, wherein the capping layer has a thickness less than about 3 nm.

29. The method of claim 26, wherein the capping layer comprises a group VIII metal.

30. The method of claim 26, further comprising selecting the capping layer to decrease the reflectivity of the reflection photomask by less than about 20% of the reflectivity of the reflection layer.

31. The method of claim 30, wherein the capping layer has a thickness less than about 6 nm.

32. The method of claim 25, wherein forming a capping layer comprises forming the capping layer on the reflection layer and the absorber pattern.

33. The method of claim 25, wherein the capping layer comprises a material having a higher oxidation resistance than silicon.

34. The method of claim 25, wherein the capping layer comprises ruthenium.

35. The method of claim 25, wherein the capping layer comprises a group VIII metal.

36. The method of claim 25, further comprising forming a buffer layer of ruthenium interposed between the reflection layer and the absorber pattern.

37. The method of claim 25, further comprising forming a buffer layer of a group VIII metal interposed between the reflection layer and the absorber pattern.

38. The method of claim 25, further comprising forming a first buffer layer interposed between the reflection layer and the absorber pattern, and wherein the first buffer layer is on the reflection layer in a reflection region between portions of the absorber pattern.

39. The method of claim 38, further comprising forming the first buffer layer in the reflection region less thick than the first buffer layer between the reflection layer and the absorber pattern.

40. The method of claim 38, further comprising forming a second buffer layer interposed between the first buffer layer and the absorber pattern, and wherein the capping layer is directly on the first buffer layer in the reflection region.

41. The method of claim 25, further comprising forming a stress relaxation layer interposed between the substrate and the reflection layer.

42. The method of claim 41, wherein the stress relaxation layer comprises ruthenium or molybdenum.

* * * * *

UNITED STATES PATENT AND TRADEMARK OFFICE
CERTIFICATE OF CORRECTION

PATENT NO. : 6,998,200 B2 Page 1 of 1
APPLICATION NO. : 10/404398
DATED : February 14, 2006
INVENTOR(S) : Lee It is certified that error appears in the above-identified patent and that said Letters Patent is hereby corrected as shown below:

Column 10,
Line 49 should read -- 30. The method of claim 25, further comprising selecting --

Signed and Sealed this

Fourth Day of July, 2006

JON W. DUDAS
*Director of the United States Patent and Trademark Office*